(12) United States Patent
Roeder et al.

(10) Patent No.: US 9,619,325 B2
(45) Date of Patent: Apr. 11, 2017

(54) METHOD FOR RENEWING DATA IN ORDER TO INCREASE THE RELIABILITY OF FLASH MEMORIES

(71) Applicant: HYPERSTONE GMBH, Constance (DE)

(72) Inventors: Martin Roeder, Constance (DE); Christoph Baumhof, Radolfzell (DE); Axel Mehnert, Reichenau (DE); Franz Schmidberger, Constance (DE)

(73) Assignee: Hyperstone GmbH, Constance (DE)

( * ) Notice: Subject to any disclaimer, the term of this patent is extended or adjusted under 35 U.S.C. 154(b) by 58 days.

(21) Appl. No.: 14/493,391

(22) Filed: Sep. 23, 2014

(65) Prior Publication Data
US 2015/0286526 A1 Oct. 8, 2015

(30) Foreign Application Priority Data
Apr. 3, 2014 (DE) .......... 10 2014 104 717

(51) Int. Cl.
| G11C 29/00 | (2006.01) |
| G06F 11/10 | (2006.01) |
| G11C 29/52 | (2006.01) |
| G11C 29/42 | (2006.01) |
| G11C 29/04 | (2006.01) |

(52) U.S. Cl.
CPC .......... *G06F 11/1068* (2013.01); *G11C 29/42* (2013.01); *G11C 29/52* (2013.01); *G11C 2029/0409* (2013.01); *G11C 2029/0411* (2013.01)

(58) Field of Classification Search
CPC ..... G06F 11/1068; G11C 29/42; G11C 29/52; G11C 2029/0409; G11C 2029/0411
See application file for complete search history.

(56) References Cited

U.S. PATENT DOCUMENTS

| 2007/0208904 | A1* | 9/2007 | Hsieh | G06F 12/0246 711/103 |
| 2010/0199284 | A1* | 8/2010 | Shimatani | G06F 11/26 718/103 |
| 2012/0060066 | A1* | 3/2012 | Nagadomi | G06F 11/1068 714/704 |
| 2012/0239969 | A1* | 9/2012 | Dickens | G06F 11/073 714/6.13 |
| 2013/0054871 | A1* | 2/2013 | Lassa | G06F 3/061 711/103 |
| 2013/0055046 | A1* | 2/2013 | Blodgett | G06F 11/106 714/764 |

(Continued)

FOREIGN PATENT DOCUMENTS

DE 10256509 A1 7/2004

*Primary Examiner* — April Y Blair
*Assistant Examiner* — Thien D Nguyen
(74) *Attorney, Agent, or Firm* — Laurence A. Greenberg; Werner H. Stemer; Ralph E. Locher

(57) ABSTRACT

A method renews data in a flash memory which is organized in memory units and whose memory units which have been written to are error-protected using ECC words. The memory units which have been written to are test-read in regularly activated test-reading cycles, and either individual memory units which have been written to or all memory units which have been written to are renewed on the basis of the ECC error states which have occurred in a test-reading cycle.

21 Claims, 2 Drawing Sheets

(56) References Cited

U.S. PATENT DOCUMENTS

| | | | |
|---|---|---|---|
| 2013/0185477 A1* | 7/2013 | Acuna | G06F 11/263 |
| | | | 711/103 |
| 2013/0209090 A1* | 8/2013 | Rope | H04B 17/101 |
| | | | 398/25 |
| 2014/0016413 A1* | 1/2014 | Han | G11C 16/10 |
| | | | 365/185.11 |
| 2014/0075265 A1* | 3/2014 | Hung | G06F 11/1048 |
| | | | 714/763 |
| 2014/0112070 A1* | 4/2014 | Jang | G11C 11/5628 |
| | | | 365/185.03 |
| 2015/0106667 A1* | 4/2015 | Zeng | G11C 16/3409 |
| | | | 714/704 |
| 2015/0199268 A1* | 7/2015 | Davis | G06F 12/0246 |
| | | | 711/103 |
| 2015/0205664 A1* | 7/2015 | Janik | G06F 11/1012 |
| | | | 714/764 |

* cited by examiner

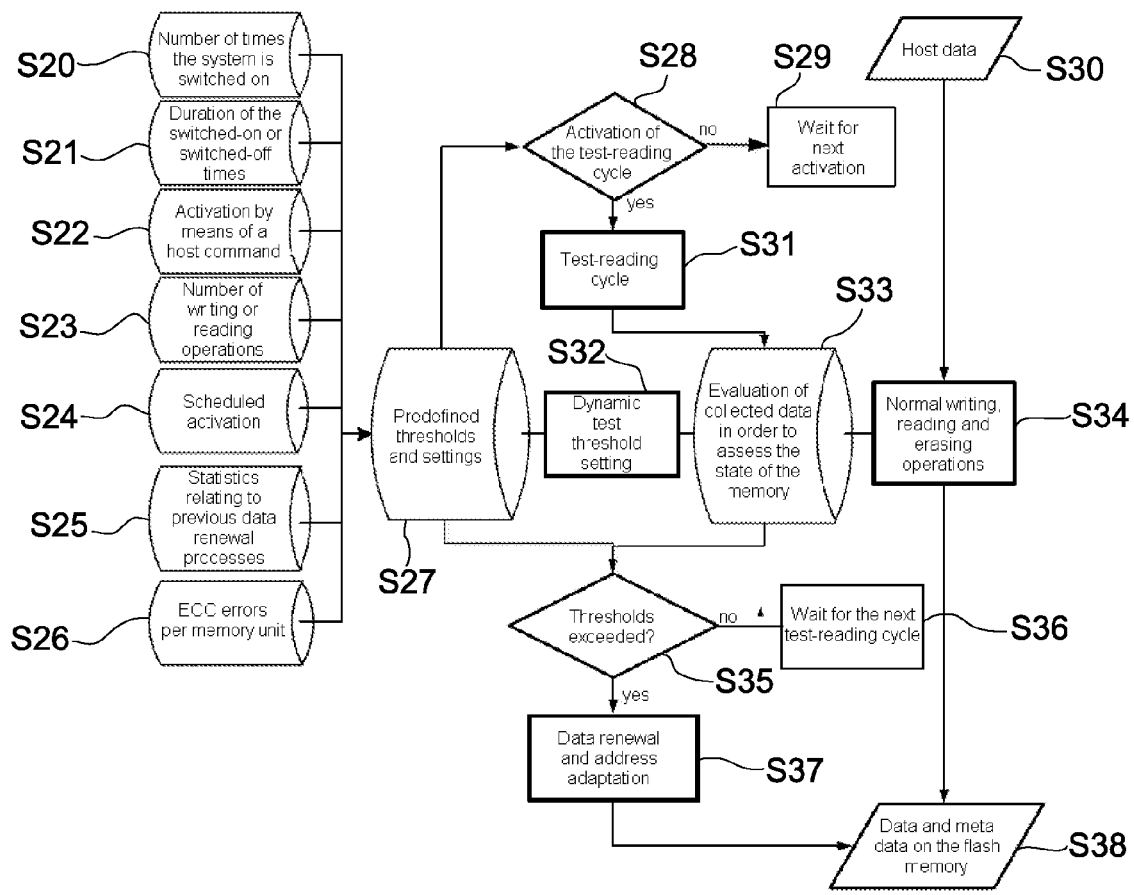

METHOD FOR RENEWING DATA IN ORDER TO INCREASE THE RELIABILITY OF FLASH MEMORIES

CROSS-REFERENCE TO RELATED APPLICATION

This application claims the priority, under 35 U.S.C. §119, of German application 10 2014 104 717.6, filed Apr. 3, 2014; the prior application is herewith incorporated by reference in its entirety.

BACKGROUND OF THE INVENTION

Field of the Invention

The invention relates to a method for renewing data in a flash memory which is organized in memory units and whose memory units which have been written to are error-protected using error correction code (ECC) words.

With increasing process miniaturization into the sub-20 nm range when producing NAND flash memory chips, the reliability problems which are already present, in principle, in all process generations increase in a highly disproportionate manner in comparison with the area gained for each information unit to be stored. If the lengths of a cell are halved, their base area is quartered but their volume shrinks to an eighth. That is to say, if a change is made from a 40 nm length of a NAND cell to a 20 nm length, although four times the amount of information can be accommodated on the same chip area, there is only an eighth of the electrons available in order to represent the information.

Problems with data management are insufficient "data retention" and excessively low "endurance", and problems with the storage operation itself are interference from adjacent cells and corruption of contents which have already been programmed by further programming operations in the same block or in adjacent blocks.

Undesirable changes in the state of charge may occur as a result of reading (read disturb) or writing (program disturb) in cells adjacent to the cells actually selected for an operation. After a particular memory page has been read very frequently, so many corrupted bits may occur in the physically adjacent memory pages that these pages can no longer be correctly read even with ECC correction. Very frequent reading means still approximately 50 million read access operations to a memory cell in the case of 70 nm flash memories before adjacent pages have become corrupt as a result of the "soft programming" occurring in the process, while only approximately 100,000 reading operations may be carried out in the 30-34 nm flash memories without compromising adjacent cell contents. In addition, susceptibility to disturb effects increases greatly with the number of writing/erasing cycles experienced by a cell. It is generally increased approximately tenfold after the number of writing/erasing cycles permissible according to the data sheet. That is to say, a page can be read only 10,000 times instead of 100,000 times in the case of a fresh flash memory without having to freshly program the data at a new location. Data retention relates to the static durability of data which have been stored once without accessing the data. In the case of current MLC flash memories, this has decreased from the formerly conventional 10 years to 1 year to even only a quarter of a year in the meantime.

As can be easily seen, the flash properties cited above compromise, in particular, those data which are not accessed or are accessed only for reading. Examples are data storage media having master data which are rarely changed, for example article master data, or else map material, for instance in a navigation device.

Irrespective of the data type, data integrity is also already compromised in the case of entirely conventional storage times in the range of a few to several months.

The prior art is used to minimize program disturb effects, namely the practice of strictly following the programming rule in the respective flash data sheet when programming pages. This means, for example, that pages inside a block are programmed in a strictly sequentially ascending order (that is to say even without gaps).

The prior art is likewise followed in order to avoid read disturb effects and a read counter is run at the block level, which counter is compared with a threshold value. If the threshold value is exceeded in a block, the contents of the block are copied over to another, freshly erased block.

Furthermore, the present prior art includes the practice of renewing block contents when more than an acceptable number of ECC errors occur when reading an ECC unit. This handles both the read disturb problems and data retention problems. However, the method alone is very unreliable because it is dependent on the host "randomly" accessing an affected area in the memory.

SUMMARY OF THE INVENTION

The object of the invention is to disclose a method which eliminates the reliability problems in a modern flash memory and allows long-term data integrity to be achieved.

The method is intended to renew data in a flash memory which is organized in memory units and whose memory units which have been written to are error-protected at the code word level using an ECC method, for example BCH. In this case, a code word may be composed of user data and/or meta data relating to the flash memory system as well as parity data which are used for error detection and correction. The method is distinguished by the fact that the memory units which have been written to are test-read in regularly activated cycles, and either memory units which have been written to or all memory units which have been written to are renewed on the basis of the ECC error states which have occurred in a test-reading cycle. In this case, the data are then transmitted from the error-prone memory units to fresh memory pages.

The method is used to attempt to detect all critical states of the flash memory and to change those parts of the memory which have to be classified as "almost no longer correctable" to a good programming state again in good time as accurately as possible.

The memory units error-protected using ECC words may form partial memory pages, memory pages or memory blocks and may be renewed together.

The test interval is activated by parameters which can be externally predefined. All activation points can be used individually or in combination.

One parameter for activating a test-reading cycle is the exceeding of a predetermined number of switch-on operations of the flash memory. This is useful if the device is switched on and off relatively frequently, for example in a navigation device in an automobile. If this activation point is set, an automatic test-reading cycle is normally additionally started in any case during first use after complete production (that is to say in the terminal) in order to cancel possible storage effects.

Another parameter for activating a test-reading cycle may be a predetermined number of writing operations on the flash memory. This is useful, for example, if the device is installed in a host which is substantially always switched on (for example a gaming machine) and whose main use is to write data.

Another parameter for activating a test-reading cycle is the predetermined number of reading operations on the flash memory. This can be used optionally and/or in combination with other parameters. This is useful, for example, if the device is installed in a host which is substantially always switched on (for example a ticket machine) and whose main use is to read data.

Another parameter for activating a test-reading cycle is the duration of the switched-on time. This can be used optionally and/or in combination with other parameters. The period during which the flash memory was switched on overall is stored with sufficient accuracy in the flash management data on the flash memory itself. The information can be used to evaluate an interval of time, after the expiry of which a test-reading cycle is intended to be started at the latest.

Another parameter for activating a test-reading cycle is the duration of the switched-off time, that is to say that time during which the device was de-energized. This can be used optionally and/or in combination with other parameters.

Yet another parameter for activating a test-reading cycle is the predetermined number of times acceptable ECC errors per code word are exceeded during normal reading operations. This can be used optionally and/or in combination with other parameters.

One or more memory units are renewed when a test threshold of ECC errors in one or more code words is exceeded in this memory unit. The number of still acceptable ECC errors per code word is stated as a percentage of the ECC correction capability of the respective memory device. This is of the order of magnitude of 67%, for example. In the case of 24-bit ECC correction capability of the system, it would then be 16 ECC errors per code word. If the stated number of times acceptable ECC errors may be exceeded has been exceeded since the last test-reading cycle or since the device was produced, a test-reading cycle is started.

For full flexibility, the host system can transmit a command which initiates a test-reading cycle.

The ECC threshold values may become different for different data types according to their importance. Memory management data, for example, are therefore essential for accessing the memory. In order to provide more important data with greater protection, lower threshold values can be used therefor.

Dynamization may be provided for the activation parameters. Since the physical properties of a flash memory considerably deteriorate with the number of erasing/writing cycles carried out, the initial test-reading cycles may be carried out at greater intervals than toward the end of the service life of the flash memory. The dynamization parameters may also be used optionally and/or in combination with static parameters.

The property of the so-called "slow pages" in multi-layer cells (MLCs) of reacting more sensitively to the read disturb and data retention effects can be used to cause test-reading cycles to take place more quickly by using only slow pages for the test.

The property of the so-called "slow pages" in MLCs of reacting more sensitively to the read disturb and data retention effects can be used to cause test-reading cycles to take place more efficiently by renewing only the content of the "slow pages" as soon as test thresholds provided therefore have been exceeded.

Depending on the type of flash memory used, test methods other than the mere testing of the ECC error frequencies can also be used. Some flash memories allow the voltage threshold values to be gradually shifted to higher or lower voltage values for the test to determine whether a digital 0 or a 1 is stored in the respective cell. In such a case, a trend as regards whether and in which direction states of charge have shifted can be determined by test-reading representative areas of the non-volatile memory. This can be determined, for example, by evaluating the changing error frequencies. Such representative areas can be tested without much effort, the test frequency can therefore be much higher and possible problems can therefore be discovered more promptly. In particular, it is possible to distinguish whether errors have occurred as a result of read disturb (threshold value has shifted upward) or low data retention (threshold value has shifted downward), that is to say whether individual data items or the content of the entire memory should be renewed.

If the test threshold of ECC errors per memory unit is exceeded, the number of previous reading operations on the tested memory unit is also advantageously determined. A check is therefore carried out in order to determine whether the ECC errors are based on a read disturb as a likely cause or whether they have rather been produced by a lack of data retention. The read disturb reading test threshold is stated as a percentage of the maximum permissible read access operations, for example 75%. If more read access operations than stated in the reading test threshold are carried out on the block, this is an indication that the ECC errors have been caused by read disturb and only this one block is renewed. If fewer reading operations have taken place, this means that the errors have been produced without read disturb, that is to say can be assigned to low data retention. However, this also means that all blocks are affected equally and the data on the entire memory device are renewed.

The progress of a test-reading or data renewal operation is periodically stored in the flash memory. When switching on the memory device, it is therefore possible to discern whether such an operation has been interrupted by virtue of the memory device being switched off, and the operation can be continued in the vicinity of the interruption point while retaining all test-reading information obtained up to the last storage process. This means that complete testing and renewal of the entire memory content (and not only the start, for instance) are ensured even when a memory device is only briefly but repeatedly switched on (for example in an automobile with a navigation system in the case of extreme short-distance operation). The data renewal operation is protected from data corruption caused by sudden power failure by virtue of the original memory location of the data to be refreshed being released (that is to say the data stored there are rendered obsolete) only when the writing operation for copying over the data has been completely concluded, that is to say the new address information has also been permanently stored. This can be achieved, for example, by using a twin method which is protected against power failure, as described in German patent DE 102 56 509 B, for instance.

In order to avoid also additionally delaying the usually time-critical switch-on operation, a configurable time delay of the start of a test-reading cycle is provided immediately after the switch-on operation.

The parameters for activating a test-reading cycle, the threshold values for initiating data renewal operations and the time delay of a test-reading cycle can be adjusted or changed when producing the flash memory and during operation by manufacturer-specific commands. The flash memory is therefore optimally set according to the application.

Other features which are considered as characteristic for the invention are set forth in the appended claims.

Although the invention is illustrated and described herein as embodied in a method for renewing data in order to increase the reliability of flash memories, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings (examples).

BRIEF DESCRIPTION OF THE SEVERAL VIEWS OF THE DRAWING

FIG. 2 is a flow diagram for activating a test-reading cycle.

DETAILED DESCRIPTION OF THE INVENTION

Figure 1:
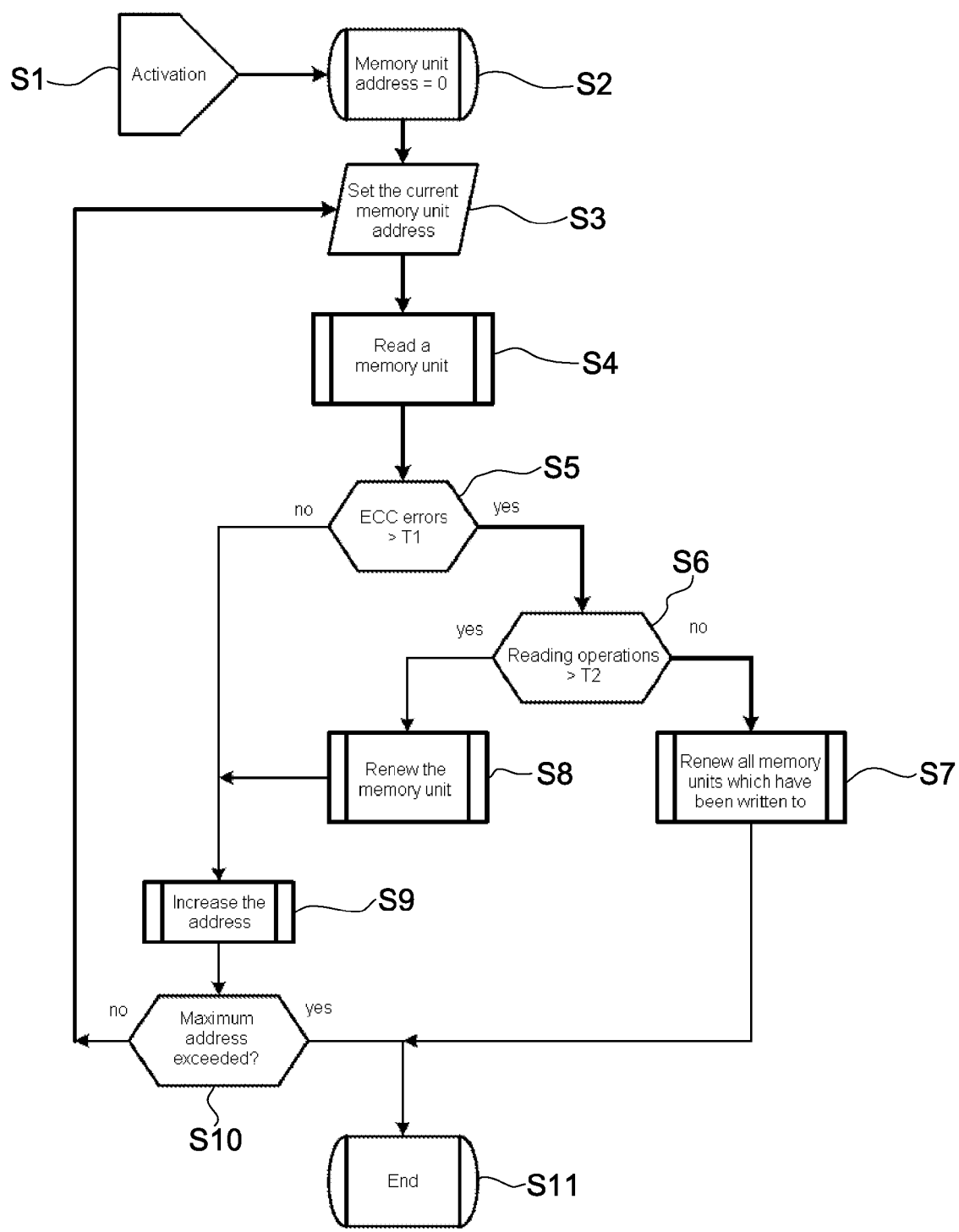
FIG. 1 is a flow diagram graphically illustrating a sequence of a test cycle according to the invention.

Referring now to the figures of the drawings in detail and first, particularly to FIG. 1 thereof, there is shown a sequence of a test cycle. With activation (step S1), a test-reading cycle for memory units of a flash memory starts. An address for reading the memory units is set to 0, steps S2, S3. The addressed memory unit is read (step S4) and ECC errors occurring in the process are evaluated, step S5. If these errors are greater than a threshold value T1, a check is also carried out in order to determine whether a second threshold value T2 for the number of previous reading operations has been exceeded, step S6. If this is not the case, it can be assumed that all memory units which have been written to are no longer reliable and the contents of all memory units which have been written to are transmitted to fresh memory blocks, step S7. The test-reading cycle is then ended, step S11.

If the threshold value T2 has been reached, it can be assumed that only the current memory unit is no longer reliable and its content is transmitted to a fresh memory block, step S8.

The address is now increased, step S9, and the test-reading cycle is continued with the next memory unit, step S3. The test-reading cycle is ended when the maximum memory address which has been written to has been exceeded, step S10.

FIG. 2 illustrates the operation of activating a test-reading cycle in more detail. Possible parameters for activation are cited. These are in this case:
The number of times the system is switched on, S20;
The duration of the switched-on or switched-off times, S21;
Activation by a host command, S22;
The number of previous writing or reading operations, S23;
Statistics relating to previous data renewal processes, S25;
The ECC errors per memory unit, S26; and
Scheduled activation, S24.

The thresholds and other settings for activation are determined from these parameters, S27.

The host data are transmitted to the flash memory using normal writing, reading and erasing operations S28-S34 and meta data are stored, S38. These operations are evaluated in order to assess the state of the memory. The test thresholds are possibly dynamically changed therefrom.

If the thresholds are exceeded by the settings obtained in this manner, S35-S36, the data are renewed for one or more memory units, S37, and are therefore written to the flash memory in refreshed form.

The invention claimed is:

1. A method for renewing data in a flash memory organized in memory units and the memory units which have been written to are error-protected using ECC words, which comprises the steps of:
test-reading the memory units which have been written to via regularly activated test-reading cycles based upon a predetermined rule not dependent on a single read or write cycle;
determining a number of reading operations on tested memory units;
renewing either individual ones of the memory units which have been written to or all of the memory units which have been written on a basis of ECC error states which have occurred in a test-reading cycle when a test threshold of ECC errors per code word is exceeded in at least one of the memory units, wherein all of the memory units of the flash memory which have been written to are renewed, when a reading test threshold has not been exceeded and renewing only one of the memory units which have been written to when the reading test threshold has been exceeded.

2. The method according to claim 1, wherein the memory units error-protected using the ECC words form partial memory pages, memory pages or memory blocks.

3. The method according to claim 1, which further comprises providing a parameter for activating the test-reading cycle, the parameter is a predetermined number of switch-on operations of the flash memory.

4. The method according to claim 1, which further comprises providing a parameter for activating the test-reading cycle, the parameter is a predetermined number of writing operations on the flash memory.

5. The method according to claim 1, which further comprises providing a parameter for activating the test-reading cycle, the parameter is a predetermined number of reading operations on the flash memory.

6. The method according to claim 1, which further comprises providing a parameter for activating the test-reading cycle, the parameter is a predetermined number of times a still acceptable number of ECC errors per code word is exceeded.

7. The method according to claim 1, which further comprises providing a parameter for activating the test-reading cycle, the parameter is a duration of a switched-on time of the flash memory.

8. The method according to claim 1, which further comprises providing a parameter for activating the test-reading cycle, the parameter is a duration of a switched-off time of the flash memory.

9. The method according to claim 1, wherein a first test threshold is approximately 67% of still acceptable ECC errors per code word.

10. The method according to claim 1, which further comprises setting test thresholds to be different for different data types.

11. The method according to claim 1, which further comprises adapting values of parameters for activating the test-reading cycle according to an age of the flash memory.

12. The method according to claim 1, which further comprises activating the test-reading cycle via a command from a host system.

13. The method according to claim 1, which further comprises carrying out the test-reading cycles and the renewal of the data only in the memory units which are identified as "slow pages" on a basis of test thresholds provided therefor.

14. The method according to claim 1, wherein when test-reading a number of the memory units, use is made of a reading method which repeatedly reads same memory units with differently set reading voltage threshold values.

15. The method according to claim 1, which further comprises setting the reading test threshold to be approximately 75% of a maximum permissible reading operations for the memory units.

16. The method according to claim 1, which further comprises recording a progress of the test-reading cycle and of a data renewal operation in the flash memory.

17. The method according to claim 16, wherein after a power failure, determining whether the test-reading cycle or the data renewal operation has been interrupted and an operation is continued in a vicinity of an interruption point while retaining all test-reading information obtained up to a last storage process.

18. The method according to claim 1, which further comprises protecting a data renewal operation in an event of a power failure by virtue of a fact that an original memory location of the data to be renewed is released only when a writing operation for copying over the data has been completely concluded and new address information for a new memory unit has been permanently stored.

19. The method according to claim 1, which further comprises providing a configurable time delay at a start of the test-reading cycle immediately after the flash memory has been switched on.

20. The method according to claim 1, wherein parameters for activating the test-reading cycle, threshold values for initiating data renewal operations and a time delay of the test-reading cycle can be adjusted or changed when producing the flash memory and during operation by means of manufacturer-specific commands.

21. A non-transitory flash memory having computer-executable instructions for performing a method according to claim 1.

* * * * *